(12) United States Patent
Takahashi et al.

(10) Patent No.: US 11,137,193 B2
(45) Date of Patent: Oct. 5, 2021

(54) CRYOGENIC COOLING APPARATUS

(71) Applicants: Kabushiki Kaisha Toshiba, Minato-ku (JP); Toshiba Energy Systems & Solutions Corporation, Kawasaki (JP)

(72) Inventors: Masahiko Takahashi, Yokosuka (JP); Hayato Nezuka, Yokohama (JP)

(73) Assignees: Kabushiki Kaisha Toshiba, Minato-ku (JP); Toshiba Energy Systems & Solutions Corporation, Kawasaki (JP)

( * ) Notice: Subject to any disclaimer, the term of this patent is extended or adjusted under 35 U.S.C. 154(b) by 267 days.

(21) Appl. No.: 16/381,023

(22) Filed: Apr. 11, 2019

(65) Prior Publication Data

US 2019/0353419 A1    Nov. 21, 2019

(30) Foreign Application Priority Data

May 17, 2018    (JP) .............................. JP2018-095373

(51) Int. Cl.
*F25D 19/00*    (2006.01)
*H05K 7/20*    (2006.01)
*H01F 6/04*    (2006.01)

(52) U.S. Cl.
CPC ............. *F25D 19/006* (2013.01); *H01F 6/04* (2013.01); *H05K 7/20372* (2013.01)

(58) Field of Classification Search
CPC ........ F25D 19/006; F25D 23/006; F25D 3/10; H05K 7/20372; H01F 6/04; F25B 2309/1413; F25B 2309/1406; F25B 9/00; F25B 9/10; F25B 9/14; F25B 9/145; F25B 41/20; F17C 1/00; C01B 3/0089; G01R 33/3815
See application file for complete search history.

(56) References Cited

U.S. PATENT DOCUMENTS 2,565,296 A * 8/1951 Chyle ................... F16L 51/029
                                                        138/121
4,765,153 A * 8/1988 Wachi ..................... F17C 3/085
                                                         62/383

(Continued)

FOREIGN PATENT DOCUMENTS

CN         1587886 A       3/2005
CN       202384127 U       8/2012

(Continued)

*Primary Examiner* — Emmanuel E Duke
(74) *Attorney, Agent, or Firm* — Oblon, McClelland, Maier & Neustadt, L.L.P.

(57) ABSTRACT

A cryogenic cooling apparatus includes: a vacuum container; a first bellows connected to a peripheral portion of an opening provided in the vacuum container; a flange provided at a tip of the first bellows on a side opposite to the opening of the vacuum container and configured to fix a refrigerator; a first sleeve connected to a peripheral edge portion of an opening of the flange, into which the refrigerator is inserted, and configured to form a first accommodation space; a first heat-transfer block provided at a tip of the first sleeve on a side opposite to the flange and thermally connected to the first cooling object by being brought into contact with a first cooling block of the refrigerator; and a second bellows formed in a part of the first sleeve and configured to expand or contract the accommodation space depending on the refrigerator inserted into the accommodation space.

5 Claims, 5 Drawing Sheets

(56) References Cited

U.S. PATENT DOCUMENTS

| | | | |
|---|---|---|---|
| 4,986,077 A | 1/1991 | Saho et al. | |
| 5,235,818 A * | 8/1993 | Horikawa | F25D 19/006 505/892 |
| 5,682,751 A * | 11/1997 | Langhorn | F25D 19/006 62/383 |
| 5,934,082 A * | 8/1999 | Steinmeyer | F25D 19/006 62/51.1 |
| 6,438,966 B1 * | 8/2002 | Sarwinski | F25D 19/006 165/185 |
| 8,069,675 B2 * | 12/2011 | Radovinsky | F25D 19/006 62/6 |
| 2005/0229620 A1 * | 10/2005 | Kirichek | F25D 19/00 62/295 |
| 2007/0214802 A1 * | 9/2007 | Nemoto | G01R 33/3815 62/47.1 |
| 2007/0271933 A1 * | 11/2007 | Miki | C01B 3/0089 62/51.1 |

FOREIGN PATENT DOCUMENTS

| | | | | |
|---|---|---|---|---|
| CN | 107806736 A | 3/2018 | | |
| EP | 0773450 A1 * | 5/1997 | | H01F 6/065 |
| GB | 2 233 750 A | 1/1991 | | |
| JP | 2004-53068 | 2/2004 | | |
| JP | 2007-303814 | 11/2007 | | |
| WO | WO 2005/100888 A1 | 10/2005 | | |

* cited by examiner

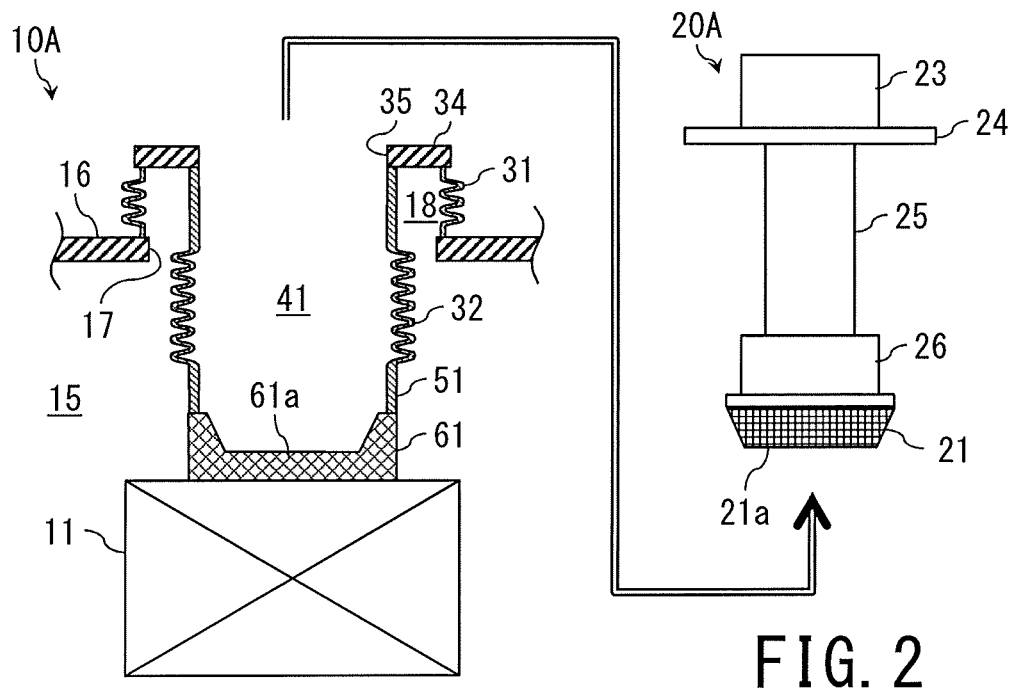
FIG. 2
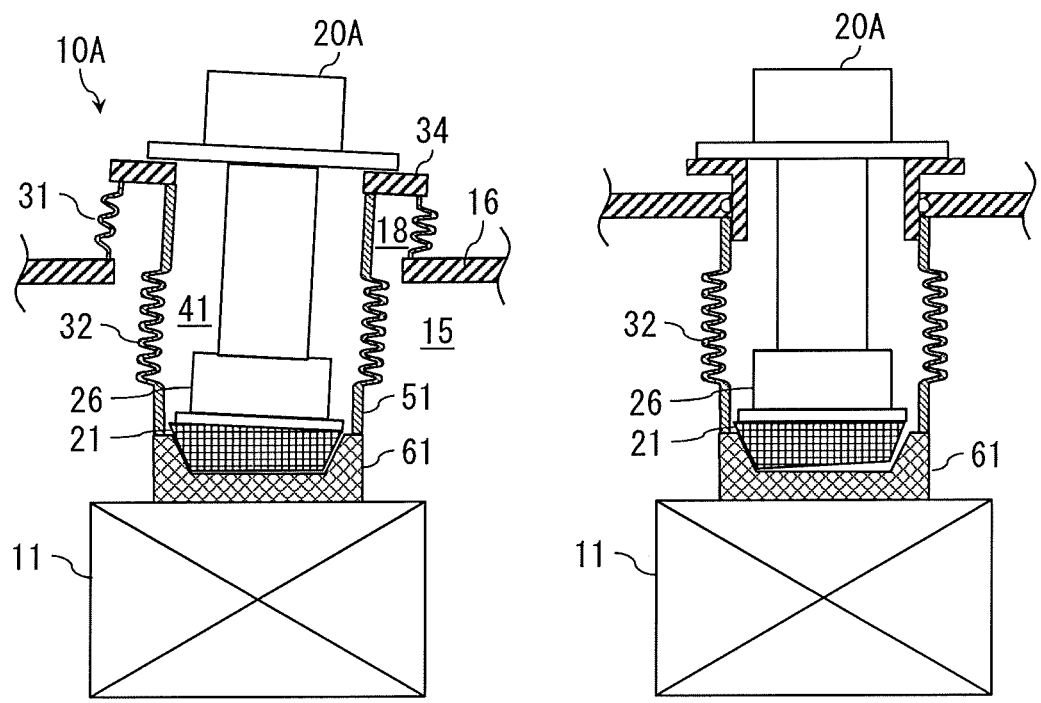
(EXAMPLE)
FIG. 3A
(COMPARATIVE EXAMPLE)
FIG. 3B

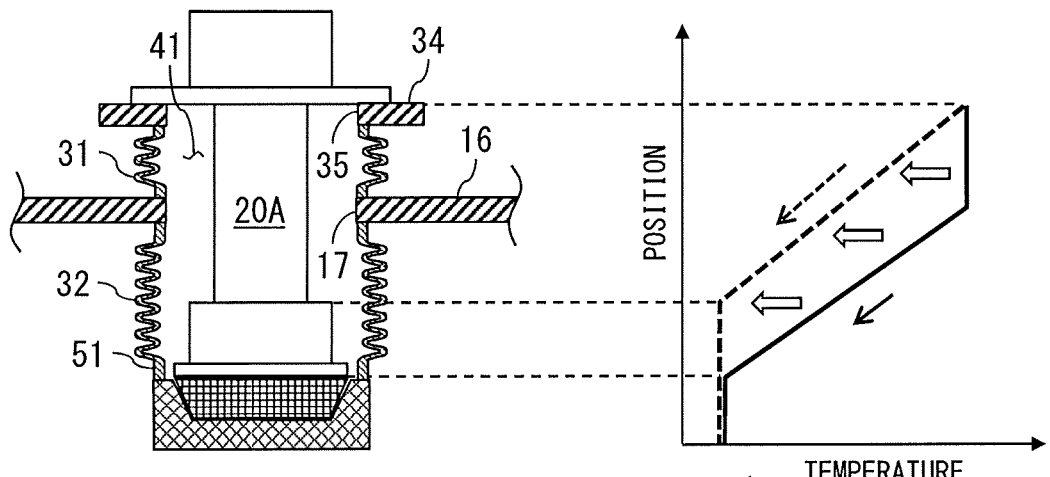
FIG. 4A (COMPARATIVE EXAMPLE)
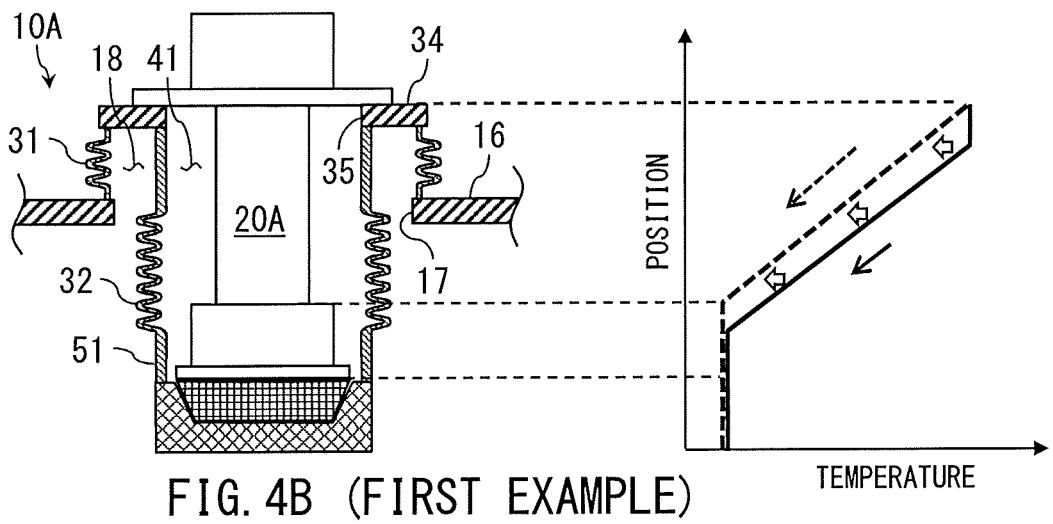
FIG. 4B (FIRST EXAMPLE)
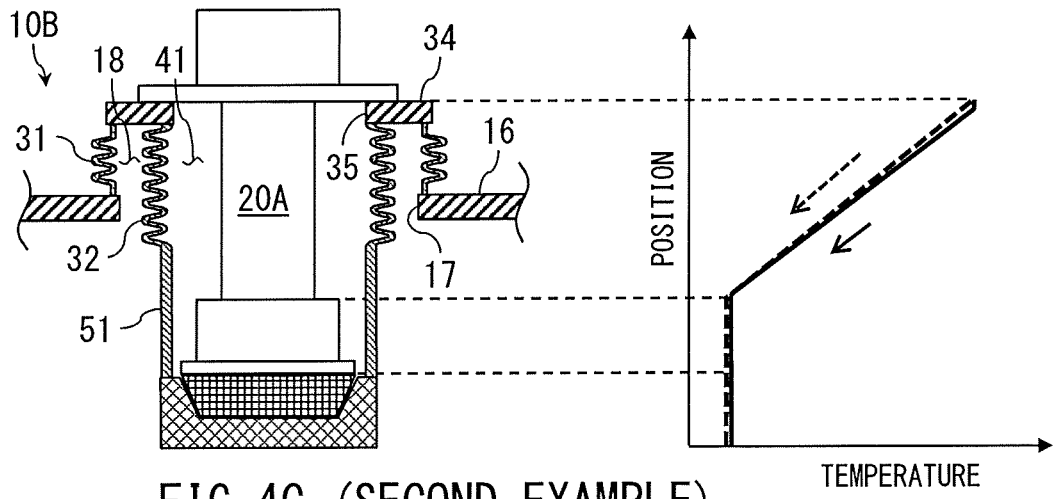
FIG. 4C (SECOND EXAMPLE)

CRYOGENIC COOLING APPARATUS

CROSS-REFERENCE TO RELATED APPLICATION

This application claims the benefit of priority of Japanese Patent Application No. 2018-095373, filed on May 17, 2018, the entire contents of which are incorporated herein by reference.

FIELD

Embodiments of the present invention relate generally to a cryogenic cooling apparatus for cooling an object to be cooled to a cryogenic temperature

BACKGROUND

In order to maintain a superconducting state, there is a demand for a technique of stably cooling a cooling object such as a superconducting magnet to a cryogenic temperature of 80K or lower by using a refrigerator or a cryogen such as liquid helium. Among them, the cooling method of using a refrigerator is easy to handle, so its application range has been expanding in recent years.

This refrigerator needs maintenance such as replacement of its sliding seal about once a year, and it is necessary to take out the contents of the refrigerator by disassembly in the maintenance work. When the maintenance work is performed in a state where the superconducting magnet is cooled, there is a possibility that the interior of the refrigerator freezes and the performance of the refrigerator degrades.

Accordingly, it is necessary to raise temperature of a superconducting magnet to room temperature but it takes time to re-cool a large superconducting magnet. In some cases, it takes several weeks to re-cool a large superconducting magnet. For this reason, there has been proposed a cryogenic cooling apparatus in which its refrigerator is exchanged in a state where cooling of its superconducting magnet is maintained.

[Patent Document 1] JP2004-53068A
[Patent Document 2] JP2007-303814A

However, in the conventional cryogenic cooling apparatus that replaces its refrigerator while maintaining the cooling state, there is a problem that its cooling performance of the cooling object is lowered. This is because the contact becomes insufficient due to errors in assembly of respective components and/or deviation caused by heat shrinkage, and thus the conductivity of the cold heat generated in the refrigerator deteriorates.

In view of the above-described problem, an object of embodiments of the present invention is to provide a cryogenic cooling apparatus that has excellent cooling performance of a cooling object and can replace its refrigerator while maintaining the cooling state.

BRIEF DESCRIPTION OF THE DRAWINGS

FIG. 2 is a schematic diagram illustrating a state in which the refrigerator is detached from the cryogenic cooling apparatus according to the first embodiment;

FIG. 3A is a schematic diagram of an example for illustrating a state in which a refrigerator is attached to the cryogenic cooling apparatus according to the first embodiment;

FIG. 3B is a schematic diagram of a comparative example for illustrating a state in which a refrigerator is attached to a cryogenic cooling apparatus unequipped with a first bellows;

FIG. 4A is a schematic diagram of a comparative example for illustrating cooling characteristics of a cryogenic cooling apparatus in which a communication space is not formed by a first bellows;

FIG. 4B is a schematic diagram of a first example of the cryogenic cooling apparatus according to the first embodiment for illustrating its cooling characteristics;

FIG. 4C is a schematic diagram of a second example of the cryogenic cooling apparatus according to the first embodiment for illustrating its cooling characteristics;

DETAILED DESCRIPTION

First Embodiment

Hereinbelow, embodiments of the present invention will be described by referring to the accompanying drawings.

Figure 1:
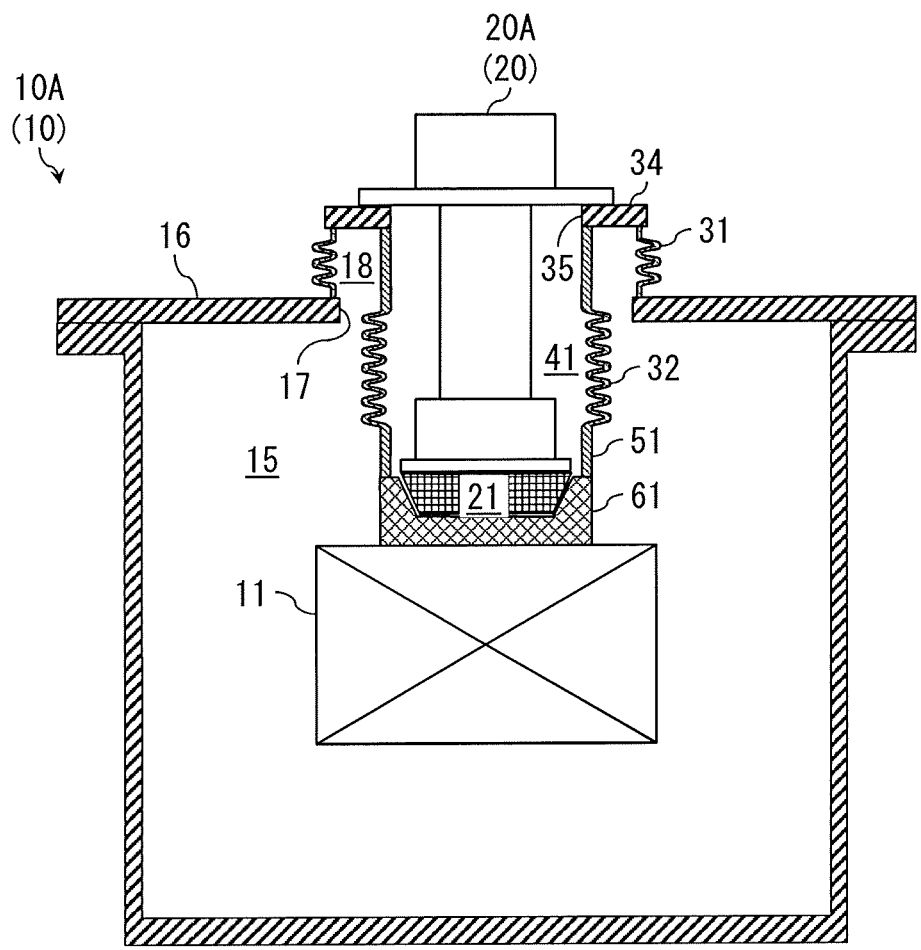
FIG. 1 is a configuration diagram illustrating a cryogenic cooling apparatus according to a first embodiment of the present invention.

FIG. 1 is a configuration diagram illustrating a cryogenic cooling apparatus 10A (10) according to a first embodiment of the present invention.

FIG. 2 is a schematic diagram of the cryogenic cooling apparatus 10A according to the first embodiment for illustrating a state in which its refrigerator 20A is detached from the cryogenic cooling apparatus 10A.

As shown in FIG. 1 (and FIG. 2 as required), the cryogenic cooling apparatus 10A includes a vacuum container 16, a first bellows 31, a flange 34, a sleeve 51, a heat-transfer block 61, and a second bellows 32. The vacuum container 16 forms an airtight space 15 that is capable of forming a vacuum, and accommodates a cooling object 11 in its inside. The first bellows 31 is connected to a peripheral portion of an opening 17 provided in the vacuum container 16 and forms an extendable and contractible communication space 18, which is in contact with the atmosphere at its outer periphery and is spatially connected to the airtight space 15 at its inner periphery. The flange 34 is provided at the tip of the first bellows 31 on the side opposite to the opening 17 of the vacuum container 16 and fixes the refrigerator 20A. The sleeve 51 is connected to the peripheral portion of an opening 35 of the flange 34, into which the refrigerator 20A is inserted, and forms an accommodation space 41, which is in contact with the airtight space 15 at its outer periphery and accommodates the refrigerator 20A in its inside. The heat-transfer block 61 is provided at the end of the sleeve 51 on the side opposite to the flange 34 and is thermally coupled to the cooling object 11 by being brought into contact with a cooling block 21 of the refrigerator 20A. The second bellows 32 is formed in a part of the sleeve 51, and expands or contracts the accommodation space 41 depending on the refrigerator 20A to be inserted.

Inside the vacuum container 16, a cooling object (e.g., superconducting coil) fixed by a non-illustrated support member is accommodated. The material and shape of the non-illustrated support member are selected in such a manner that the heat transfer from the outside of the vacuum container 16 to the cooling object 11 is minimized and the thermal conductivity becomes small while its mechanical rigidity is being maintained. Further, the interior of the vacuum container 16 is depressurized by using a non-illustrated vacuum device and then the cooling object 11 is subjected to vacuum insulation, which makes it possible to suppress heat transfer from the vacuum vessel 16 to the cooling object 11 via the airtight space 15.

As shown in FIG. 2, the refrigerator 20A is a one-stage type refrigerator, and its external appearance is composed of a drive unit 23, a mounting flange 24, a cooling cylinder 25, and a cold head 26. The refrigerator 20A adiabatically expands working gas inside the cooling cylinder 25, and generates cold heat of 40 to 70K in the cold head 26 at its tip. For instance, types of the refrigerator 20A to be used include a GM (Gifford-McMahon) refrigerator, a Solvay refrigerator, and a pulse tube refrigerator.

The cold head 26 is provided with a cooling block 21 that has a conical contact surface 21a. The contact surface 21a of the cooling block 21 contacts a contact surface 61a of a heat-transfer block 61, wherein the contact surface 61a has a reversed shape with respect to the contact surface 21a such that the cooling block 21 fits into the heat-transfer block 61. The contact surface 21a transmits the cold heat generated by the refrigerator 20A to the heat-transfer block 61. The refrigerator 20A having such a configuration is attached to and detached from the cooling device 10 while maintaining the vacuum state, without having to return the airtight space 15 to the atmospheric pressure.

The configuration of the main body side of the cryogenic cooling apparatus 10A will be described by referring to FIG. 2.

The flange 34 is airtightly fastened to the mounting flange 24 of the refrigerator 20A, which is inserted into the opening 35, by using fastening members such as bolts (not shown). One end of the sleeve 51 is connected to the periphery of the opening 35 of the flange 34 by, e.g., welding. Further, one end of the first bellows 31 is connected to the outer peripheral edge of the flange 34.

One end of the first bellows 31 is connected to the peripheral portion of the opening 17 of the vacuum container 16 and the other end of the first bellows 31 is connected to the outer peripheral edge of the flange 34. The first bellows 31 elastically supports the flange 34 with respect to the vacuum container 16. As a result, the first bellows 31 forms an expandable and contractible communication space 18 that is spatially connected to the airtight space 15 by its inner peripheral surface, the outer peripheral surface of the sleeve 51, and the bottom surface of the flange 34.

Since the first bellows 31 is configured as described above, the relative fixed position of the refrigerator 20A with respect to the vacuum container 16 can be adjusted while airtightness of the airtight space 15 of the vacuum container 16 and airtightness of the accommodation space 41 of the sleeve 51 are being maintained.

One end of the sleeve 51 is connected to the peripheral edge portion of the opening 35 of the flange 34 and the other end of the sleeve 51 is connected to the outer peripheral edge of the heat-transfer block 61. The inner peripheral surface of the sleeve 51 and the upper surface of the heat-transfer block 61 form the accommodation space 41 for accommodating the refrigerator 20A to be inserted from the opening 35 of the flange 34. The opening 35 of the flange 34 is hermetically sealed with the mounting flange 24 of the refrigerator 20, and thus the accommodation space 41 becomes a hermetically sealed space isolated from outside air and the airtight space 15 in which the cooling body 11 exists.

The second bellows 32 is formed on a part of the body of the sleeve 51 and elastically stretches and contracts this body. Since a part of the body of the sleeve 51 is formed by the second bellows 32, the accommodation space 41 can be expanded and contracted according to the refrigerator 20A having been inserted. Consequently, a dimensional error of the refrigerator 20A, deviation of the insertion angle, deviation due to thermal contraction at the time of cooling, or mounting deviation of the cooling block 21 is absorbed, so that both of the airtightness of the accommodation space 41 and the contactability between the cooling block 21 and the heat-transfer block 61 can be achieved.

The heat-transfer block 61 has a contact surface 61a having a reversed shape with respect to the contact surface 21a of the cooling block 21, and one end of the sleeve 51 is connected to the outer edge of the contact surface 61a. The heat-transfer block 61 is connected to the cooling object 11 on the opposite side of the contact surface 61a, and thermally couples the refrigerator 20A and the cooling object 11.

The accommodation space 41 is filled with gas (e.g., helium gas) having a high thermal conductivity in the vapor phase state in the preset temperature range so that the cold heat generated by the refrigerator 20A is efficiently transmitted to the heat-transfer block 61. The heat-transfer block 61 and the cooling block 21 of the refrigerator 20A accommodated in the accommodation space 41 can have a large contact area with each other, and a highly heat-conductive gas fills the gap formed in the vicinity of the contact portion. Thus, a satisfactory heat transfer path is formed.

FIG. 3A and FIG. 3B simulate a case where the cooling block 21 is attached to the cold head 26 of the refrigerator 20A in a tilted manner. FIG. 3A is a schematic diagram of an example for illustrating a state in which the refrigerator 20A is attached to the cryogenic cooling apparatus 10A according to the first embodiment. FIG. 3B is a schematic diagram of a comparative example for illustrating a state in which the refrigerator 20A is attached to a cryogenic cooling apparatus unequipped with a first bellows.

In the example shown in FIG. 3A, it is assumed that the refrigerator 20A is inserted in the accommodation space 41 and the cooling block 21 mounted inclinedly is brought into contact with the heat-transfer block 61. In this case, the first bellows 31 and the second bellows 32 are deformed, and thereby, the flange 34 with the refrigerator 20A fixed thereon is appropriately tilted with respect to the vertical or horizontal direction. Consequently, the inclination of the cooling block 21 is absorbed.

Further, due to the pressure difference between the atmospheric pressure outside the vacuum container 16 and the internal pressure of the airtight space 15 and the communication space 18, the refrigerator 20A is strongly attracted toward the heat-transfer block 61. As a result, the gap between the cooling block 21 and the heat-transfer block 61 is reduced, the contact therebetween is satisfactorily maintained, and the thermal resistance is reduced.

In contrast, in the comparative example shown in FIG. 3B, deformation of both of the first bellows (which is not provided in the comparative example) and the second bellows 32 in the present invention is not guaranteed, and thus the inclination of the cooling block 21 cannot be absorbed. Consequently, a large gap is generated at the contact between the heat-transfer block 61 and the cooling block 21.

Although only the second bellows 32 is provided in the comparative example of FIG. 3B, the same holds true for case where only the first bellows 31 is provided. That is, in the case where only the first bellows 31 is provided, the inclination of the cooling block 21 cannot be absorbed similarly, which makes the contact unsatisfactory and increases the thermal resistance.

Although FIG. 3A and FIG. 3B illustrate the cases where the cooling block 21 is inclinedly mounted, there are other cases where the contact between the cooling block 21 and the heat-transfer block 61 can be satisfactorily maintained by absorbing a dimensional error and/or deviation described below. For instance, in a case where the cooling object 11 with the heat-transfer block 61 connected thereto is supported at the position that deviates from the ideal position with respect to the vacuum container 16, the contact between the cooling block 21 and the heat-transfer block 61 can be satisfactorily maintained by absorbing the positional deviation. Also in a case where dimensional error of other devices, deviation of the insertion angle of the refrigerator 20A, or deviation due to heat shrinkage during cooling occurs, the above-described contact can be satisfactorily maintained by absorbing such a dimensional error or deviation.

FIG. 4A is a schematic diagram of a comparative example for illustrating cooling characteristics of a cryogenic cooling apparatus in which a communication space is not formed by the first bellows 31.

FIG. 4B is a schematic diagram of a first example of the cryogenic cooling apparatus 10A according to the first embodiment for illustrating its cooling characteristics.

FIG. 4C is a schematic diagram of a second example of the cryogenic cooling apparatus 10B according to the first embodiment for illustrating its cooling characteristics. In the graph of the cooling characteristics shown on the right side of each of FIG. 4A to FIG. 4C, the temperature distribution at the boundary position with the refrigerator 20A in the accommodation space 41 is indicated by the broken line and the temperature distribution at the boundary position with the sleeve 51 is indicated by the solid line. Arrows in the respective graphs indicate the direction and amount of heat flow.

The configuration of the comparative example shown in FIG. 4A differs from the first and second examples in that the sleeve 51 on which the second bellows 32 is formed is connected not to the opening 35 of the flange 34 but to the opening 17 of the vacuum container 16. Accordingly, in the comparative example, there is no communication space 18 formed by the inner periphery of the first bellows 31 and the outer periphery of the sleeve 51 as in the examples.

For this reason, in the comparative example of FIG. 4A, the accommodation space 41 is in contact with the outside air only via the first bellows 31, and thus it is inevitable that the temperature gradient in the horizontal direction of the accommodation space 41 becomes large as shown in the cooling characteristic graph. Hence, in the comparative example, there is much heat intrusion into the accommodation space 41.

Contrastively, in the first example shown in FIG. 4B, the space between the outside air and the accommodation space 41 is vacuum-insulated by the communication space 18, and thus the temperature gradient in the horizontal direction of the accommodation space 41 becomes small as indicated in the cooling characteristic graph. Hence, in the first example, heat intrusion into the accommodation space 41 is reduced. The amount of heat intrusion was measured, and the result was 17 W for the comparative example and 7 W for the first example. In the first example, heat intrusion was reduced to ½ or less of the comparative example. As a result, it can be seen that the cryogenic cooling device 10A of the first example 1 is superior to the comparative example in terms of cooling performance of the cooling object 11 (FIG. 1).

In the cryogenic cooling device 10B of FIG. 4C, one end of the second bellows 32 forming a part of the sleeve 51 is directly connected to the opening 35 of the flange 34. Consequently, the communication space 18 is formed by the outer periphery of the second bellows 32 and the inner periphery of the first bellows 31. Hence, in the second example shown in FIG. 4C, the temperature gradient in the horizontal direction of the accommodation space 41 is further reduced as shown in the cooling characteristic graph and thus the heat intrusion into the accommodation space 41 is further reduced. Accordingly, in the cryogenic cooling device 10B of the second example, the cooling performance of the cooling object (FIG. 1) is further improved as compared with the first example.

Second Embodiment

Next, a second embodiment of the present invention will be described by referring to FIG. 5 and FIG. 6.

Figure 5:
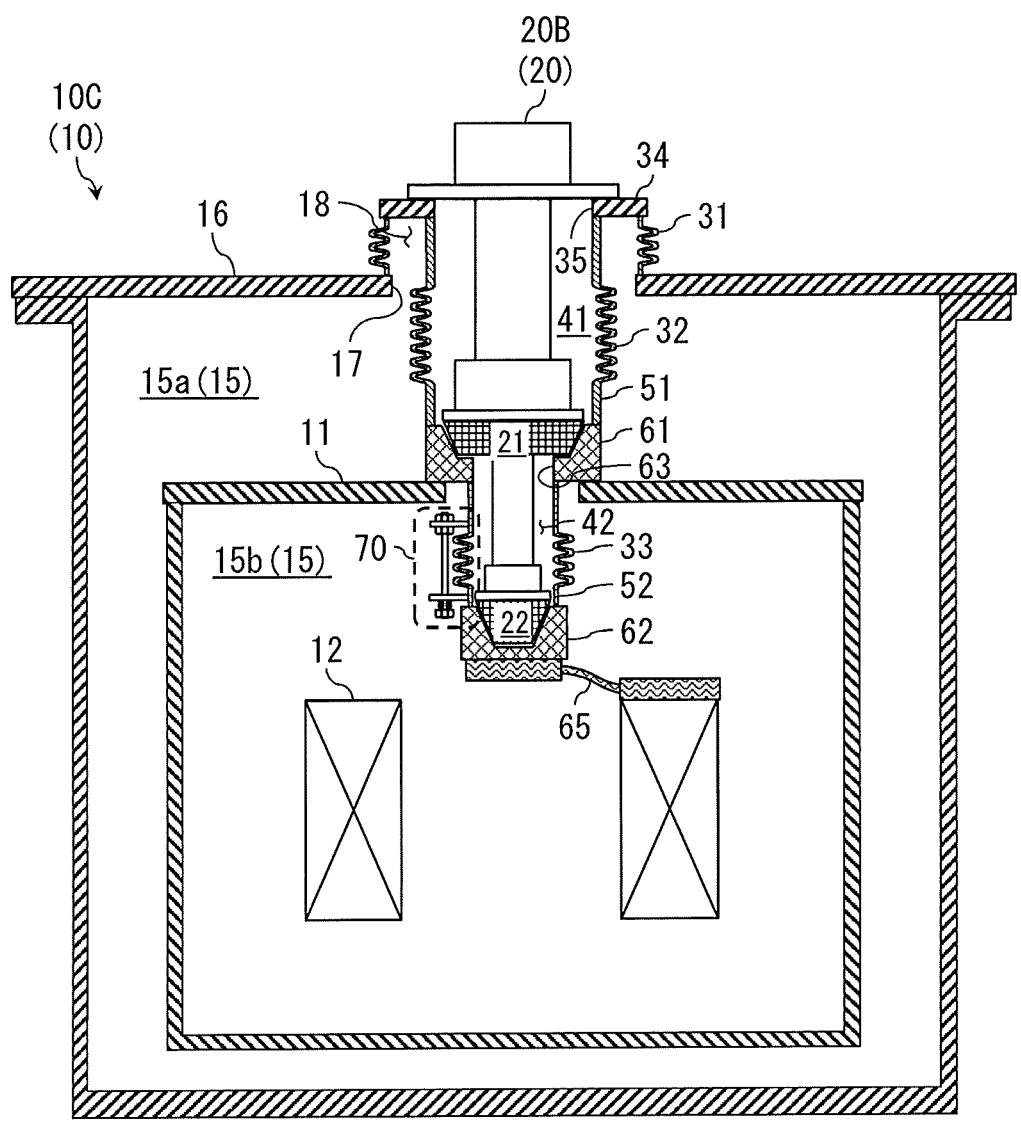
FIG. 5 is a configuration diagram illustrating a cryogenic cooling apparatus according to a second embodiment of the present invention.

FIG. 5 is a configuration diagram illustrating the cryogenic cooling apparatus 10C according to the second embodiment of the present invention.

Figure 6:
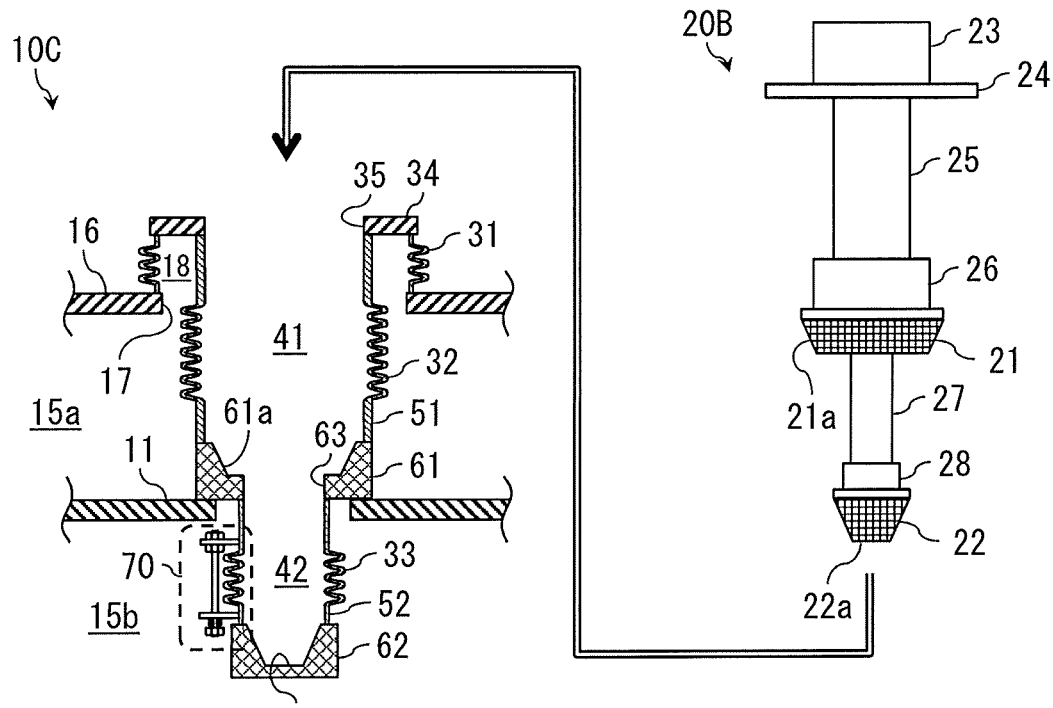
FIG. 6 is a schematic diagram illustrating the state in which the refrigerator is detached from the cryogenic cooling apparatus according to the second embodiment.

FIG. 6 is a schematic diagram illustrating the state in which the refrigerator 20B is detached from the cryogenic cooling apparatus 10C according to the second embodiment.

In FIG. 5 and FIG. 6, the same reference signs are assigned to the same components as those in FIG. 1 in terms of configuration or function, and duplicate description is omitted. In this context, only one sleeve 51 is provided in the first embodiment whereas first and second sleeves are provided in the second embodiment, but the first sleeve of the second embodiment is functionally the same as the sleeve 51 of the first embodiment and is denoted as "the first sleeve 51".

Similarly, only one heat-transfer block 61 is provided in the first embodiment whereas first and second heat-transfer blocks are provided in the second embodiment, but the first heat-transfer block of the second embodiment is functionally the same as the heat-transfer block 61 of the first embodiment and is denoted as "the first heat-transfer block 61".

Similarly, only one accommodation space 41 is provided in the first embodiment whereas first and second accommodation spaces are provided in the second embodiment, but the first accommodation space of the second embodiment is functionally the same as the accommodation space 41 of the first embodiment and is denoted as "the first accommodation space 41".

As shown in FIG. 5 (and FIG. 6 as required), the cryogenic cooling apparatus 10C includes the vacuum container 16, the first bellows 31, the flange 34, the first sleeve 51, the first heat-transfer block 61, and the second bellows 32. The vacuum container 16 forms an airtight space 15a that is capable of forming a vacuum, and accommodates a first cooling object (heat shield member) 11 in its inside. The first bellows 31 is connected to the peripheral portion of the opening 17 provided in the vacuum container 16 and forms the extendable and contractible communication space 18, which is in contact with the atmosphere at its outer periphery and is spatially connected to the airtight space 15a at its inner periphery. The flange 34 is provided at the tip of the first bellows 31 on the side opposite to the opening 17 of the vacuum container 16 and fixes the refrigerator 20B. The first sleeve 51 is connected to the peripheral portion of the opening 35 of the flange 34, into which the refrigerator 20B is inserted, and the inner periphery of the first sleeve 51 forms a first accommodation space 41 that accommodates the refrigerator 20B. The first heat-transfer block 61 is provided at the end of the first sleeve 51 on the side opposite to the flange 34, is brought into contact with a first cooling block 21 of the refrigerator 20B, and is thermally coupled to a first cooling object (heat shield member) 11. The second bellows 32 is formed in a part of the first sleeve 51, and expands or contracts the first accommodation space 41 depending on the refrigerator 20B to be inserted.

In the second embodiment, a second cooling object (superconducting coil) 12 is accommodated in a space 15b surrounded by a first cooling object (heat shield member) 11. In the refrigerator 20B, there is provided a second cooling block 22 that is set at a temperature lower than that of the first cooling block 21.

The cryogenic cooling apparatus 10C further includes a second sleeve 52, a second heat-transfer block 62, and a third bellows 33. The second sleeve 52 is connected to the peripheral portion of the opening 63 of the first heat-transfer block 61 into which the refrigerator 20B is inserted, and forms a second accommodation space 42 that is in contact with the space 15b inside the first cooling object (heat shield member) 11 at its outer periphery and accommodates the refrigerator 20B in its inside. The second heat-transfer block 62 is provided at the tip of the second sleeve 52 on the side opposite to the first heat-transfer block 61, is brought into contact with the second cooling block 22 of the refrigerator 20B, and is thermally coupled to the second cooling object (i.e., superconducting coil) 12. The third bellows 33 is formed in a part of the second sleeve 52, and expands or contracts the second accommodation space 42 depending on the refrigerator 20B to be inserted. The superconducting coil (i.e., the second cooling object) 12 and the second heat-transfer block 62 are thermally connected to each other via a flexible heat transfer plate 65 made of high purity aluminum or copper.

As shown in FIG. 6, the refrigerator 20B is a two-stage type refrigerator and its external appearance is composed of the driving unit 23, the mounting flange 24, the first cooling cylinder 25 (which is the same as the cooling cylinder 25 in the first embodiment), a first cold head 26 (which is the same as the cold head 26 in the first embodiment), a second cooling cylinder 27, and a second cold head 28. The refrigerator 20B adiabatically expands the working gas inside the first cooling cylinder 25, and generates cold heat of 40 to 70K at the first cold head 26 at the tip thereof. Further, the refrigerator 20B adiabatically expands the working gas cooled down to 40 to 70K inside the second cooling cylinder 27, and generates cold heat of 20 to 40K in the second cold head 28 at the tip thereof. For instance, types of the refrigerator 20B to be used include a GM (Gifford-McMahon) refrigerator, a Solvay refrigerator, and a pulse tube refrigerator.

In the first cold head 26, the first cooling block 21 having the conical contact surface 21a is provided. The contact surface 21a of the first cooling block 21 contacts the contact surface 61a of the first heat-transfer block 61, wherein the contact surface 61a has a reversed shape with respect to the contact surface 21a such that the first cooling block 21 fits into the first heat-transfer block 61. The contact surface 21a transmits the cold heat generated by the first cooling cylinder 25 to the first heat-transfer block 61.

In the second cold head 28, the second cooling block 22 having a conical contact surface 22a is provided. The contact surface 22a of the second cooling block 22 contacts a contact surface 62a of the second heat-transfer block 62, wherein the contact surface 62a has a reversed shape with respect to the contact surface 22a such that the second cooling block 22 fits into the second heat-transfer block 62. The contact surface 22a transmits the cold heat generated by the second cooling cylinder 27 to the second heat-transfer block 62.

The configuration of the main body side of the cryogenic cooling apparatus 10C will be described by referring to FIG. 6. The flange 34 is airtightly fastened to the mounting flange 24 of the refrigerator 20B, which is inserted into the opening 35, by using fastening members such as bolts (not shown). One end of the first sleeve 51 is connected to the periphery of the opening 35 of the flange 34 by, e.g., welding. Further, one end of the first bellows 31 is connected to the outer peripheral edge of the flange 34.

One end of the first bellows 31 is connected to the peripheral portion of the opening 17 of the vacuum container 16, and the other end of the first bellows 31 is connected to the outer peripheral edge of the flange 34. The first bellows 31 elastically supports the flange 34 with respect to the vacuum container 16. Consequently, the inner peripheral surface of the first bellows 31, the outer peripheral surface of the first sleeve 51, and the bottom surface of the flange 34 form the expandable and contractible communication space 18 that communicates with (i.e., spatially connected to) the airtight space 15a.

Since the first bellows 31 is configured in this manner, the relative fixed position of the refrigerator 20B with respect to the vacuum container 16 can be adjusted while airtightness of the airtight space 15a of the vacuum container 16 and airtightness of the accommodation spaces 41 and 42 of the sleeves 51 and 52 are being maintained.

One end of the first sleeve 51 is connected to the peripheral edge portion of the opening 35 of the flange 34 and the other end of the first sleeve 51 is connected to the outer peripheral edge of the first heat-transfer block 61. The inner peripheral surface of the first sleeve 51 and the top surface of the first heat-transfer block 61 form the first accommodation space 41 that accommodates the first cooling cylinder 25 of the refrigerator 20B.

The second bellows 32 is formed on a part of the body of the first sleeve 51 and elastically expands and contracts the body of the first sleeve 51. Since a part of the body of the first sleeve 51 is formed by the second bellows 32, the first accommodation space 41 can be expanded or contracted according to the refrigerator 20B to be inserted. This configuration absorbs a dimensional error of the first cooling cylinder 25 and the first cold head 26 of the refrigerator 20B, deviation of the insertion angle, deviation due to thermal contraction at the time of cooling, and mounting deviation of the first cooling block 21. Thus, it is possible to improve the airtightness of the accommodation spaces 41 and 42 and the contactability between the first cooling block 21 and the first heat-transfer block 61.

The first heat-transfer block 61 has the contact surface 61a having the reversed shape with respect to the contact surface 21a of the first cooling block 21, and one end of the first sleeve 51 is connected to the outer edge of the contact surface 61a. The first heat-transfer block 61 is further provided with an opening 63 through which the second cooling cylinder 27 of the refrigerator 20B passes. The first heat-transfer block 61 is connected to the first cooling object (heat shield member) 11 and transmits the cold heat, which is supplied from the first cold head 26, to the first cooling object 11.

One end of the second sleeve 52 is connected to the periphery of the opening 63 of the first heat-transfer block 61, and the other end of the second sleeve 52 is connected to the outer peripheral edge of the second heat-transfer block 62. The inner peripheral surface of the second sleeve 52 and the top surface of the second heat-transfer block 62 form the second accommodation space 42 that accommodates the second cooling cylinder 27 of the refrigerator 20B. Since the opening 35 of the flange 34 is airtightly sealed with the mounting flange 24 of the refrigerator 20, the first accommodation space 41 and the second accommodation space 42 form an enclosed space isolated from the outside air and the airtight space 15a in which the cooling object 11 exists.

The third bellows 33 is formed on a part of the body of the second sleeve 52 and elastically expands and contracts the body of the second sleeve 52. Since a part of the body of the second sleeve 52 is formed by the third bellows 33, the second accommodation space 42 can be expanded and contracted according to the refrigerator 20B to be inserted. This configuration absorbs a dimensional error of the second cooling cylinder 27 and the second cold head 28 of the refrigerator 20B, deviation of the insertion angle, deviation due to thermal contraction at the time of cooling, and mounting deviation of the second cooling block 22. Thus, it is possible to improve the contactability between the second cooling block 22 and the second heat-transfer block 62.

The second heat-transfer block 62 has the contact surface 62a having the reversed shape with respect to the contact surface 22a of the second cooling block 22, and one end of the second sleeve 52 is connected to the outer edge of the contact surface 62a. The second heat-transfer block 62 is connected to the second cooling object (i.e., superconducting coil) 12 as shown in FIG. 5 and transmits the cold heat, which is supplied from the second cold head 28, to the second cooling object 12.

The first accommodation space 41 and the second accommodation space 42 are filled with gas (e.g., helium gas) having a high thermal conductivity in the vapor phase state in the preset temperature range such that the cold heat generated by the refrigerator 20B is efficiently transmitted to each of the first heat-transfer block 61 and the second heat-transfer block 62. The first and second cooling blocks 21 and 22 of the refrigerator 20B and the first and second heat-transfer blocks 61 and 62 can increase the contact area, and highly heat-conductive gas fills the gap formed in the vicinity of the contact portion. Thus, a satisfactory heat transfer path is formed.

Figure 7:
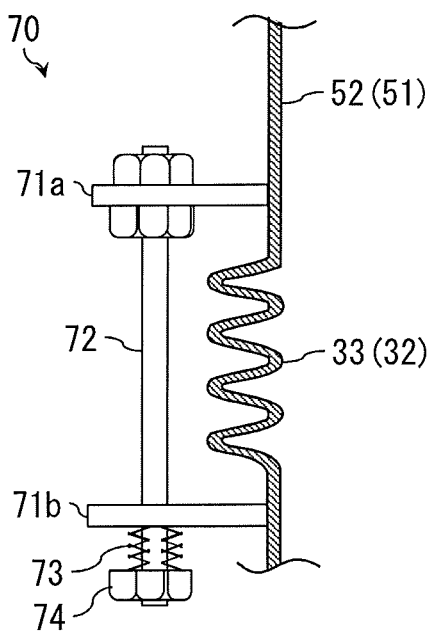
FIG. 7 is a configuration diagram of a regulation member that regulates the extension amount of the bellows.

FIG. 7 is a configuration diagram of the regulation member 70 that regulates the extension amount of the bellows 33.

The second sleeve 52 is provided with the regulation member 70 that regulates the extension amount of the third bellows 33. The regulation member 70 includes a pair of supporting members 71a and 71b (collectively denoted as 71), a supporting post 72, a stopper 74, and a biasing member 73. The pair of supporting members 71a and 71b are provided on the second sleeve 52 so as to sandwich the third bellows 33. The supporting post 72 is fixed to the supporting member 71a at its one end, and the other end side of the supporting post 72 penetrates through the other supporting member 71b. The stopper 74 is provided at one end of the supporting post 72 penetrating the support member 71b so as to prevent the supporting post 72 from falling out of the support member 71b. The biasing member 73 elastically connects the stopper 74 to the supporting member 71b through which the supporting post 72 penetrates.

This regulation member 70 functions such that the second cooling block 22 and the second heat-transfer block 62 are pressed against each other by the biasing force of the biasing member 73. This configuration reduces the gap between the second cooling block 22 and the second heat-transfer block 62 so as to maintain satisfactory contact therebetween, and thus the thermal resistance is reduced. The regulation member 70 may be provided on the first sleeve 51 so as to restrict the extension amount of the second bellows 32.

Since the cryogenic cooling apparatus of at least one embodiment described above includes the first bellows configured to expandably and contractibly form a communication space spatially connected to the vacuum container and the second bellows configured to form an accommodation space for accommodating the refrigerator, there is provided a cryogenic cooling apparatus that has excellent cooling performance of a cooling object and can replace its refrigerator while maintaining the cooling state.

Some embodiments of the present invention have been described above. These embodiments have been presented as examples. There is no intention to limit the scope of the invention. These embodiments can also be implemented in other various modes, and variously omitted, replaced, changed, and combined without departing from the gist of the invention. The embodiments and their variations are encompassed by the scope and gist of the invention. Likewise, these embodiments and variations are encompassed by the invention described in the claims and its range of equivalence.

What is claimed is:

1. A cryogenic cooling apparatus comprising:
   a vacuum container configured to form an airtight space capable of forming a vacuum and accommodate a first cooling object;
   a first bellows connected to a peripheral portion of an opening provided in the vacuum container and configured to form an expandable and contractible communication space, which is in contact with an atmosphere at an outer periphery and spatially connected to the airtight space at an inner periphery;
   a flange provided at a tip of the first bellows on a side opposite to the opening of the vacuum container and configured to fix a refrigerator;
   a first sleeve connected to a peripheral edge portion of an opening of the flange, into which the refrigerator is inserted, and configured to form a first accommodation space, which is in contact with the airtight space at an outer periphery and accommodates the refrigerator;
   a first heat-transfer block provided at a tip of the first sleeve on a side opposite to the flange and thermally connected to the first cooling object by being brought into contact with a first cooling block of the refrigerator; and
   a second bellows formed in a part of the first sleeve and configured to expand or contract the accommodation space depending on the refrigerator inserted into the accommodation space;
   wherein the first sleeve is provided with a regulation member that regulates extension amount of the second bellows;
   wherein the regulation member includes,
   a pair of supporting members provided on the first sleeve so as to sandwich the second bellows, and
   a supporting post fixed to a supporting member at its one end, and the other end side of the supporting post penetrates through the other supporting member.

2. The cryogenic cooling apparatus according to claim 1, wherein an outer periphery of the second bellows is configured to form the communication space.

3. A cryogenic cooling apparatus comprising:
a vacuum container configured to form an airtight space capable of forming a vacuum and accommodate a first cooling object;
a first bellows connected to a peripheral portion of an opening provided in the vacuum container and configured to form an expandable and contractible communication space, which is in contact with an atmosphere at an outer periphery and spatially connected to the airtight space at an inner periphery;
a flange provided at a tip of the first bellows on a side opposite to the opening of the vacuum container and configured to fix a refrigerator;
a first sleeve connected to a peripheral edge portion of an opening of the flange, into which the refrigerator is inserted, and configured to form a first accommodation space, which is in contact with the airtight space at an outer periphery and accommodates the refrigerator;
a first heat-transfer block provided at a tip of the first sleeve on a side opposite to the flange and thermally connected to the first cooling object by being brought into contact with a first cooling block of the refrigerator; and
a second bellows formed in a part of the first sleeve and configured to expand or contract the accommodation space depending on the refrigerator inserted into the accommodation space;
the cryogenic cooling apparatus, further comprising a second sleeve, a second heat-transfer block, and a third bellows,
wherein the first cooling object is a heat shield member surrounding a second cooling object accommodated in the airtight space;
the refrigerator further includes a second cooling block that is set at a temperature lower than a temperature of the first cooling block;
the second sleeve is connected to a peripheral edge portion of an opening of the first heat-transfer block, into which the refrigerator is inserted, and configured to form a second accommodation space that is in contact with the airtight space inside the heat shield member at an outer periphery and accommodates the refrigerator;
the second heat-transfer block is provided at a tip of the second sleeve on a side opposite to the first heat-transfer block and is thermally coupled to the second cooling object by being brought into contact with the second cooling block of the refrigerator; and
the third bellows is formed in a part of the second sleeve and is configured to expand or contract the second accommodation space depending on the refrigerator to be inserted.

4. The cryogenic cooling apparatus according to claim 3, wherein the first sleeve is provided with a regulation member that regulates extension amount of the second bellows.

5. The cryogenic cooling apparatus according to claim 3, wherein the second cooling object is a superconducting coil; and
the superconducting coil and the second heat-transfer block are thermally coupled to each other via a flexible heat transfer plate made of high purity aluminum or copper.

* * * * *